United States Patent
MacDonald (10) Patent No.: US 10,979,046 B2
(45) Date of Patent: Apr. 13, 2021

(54) NURSE CALL AND INTERLOCK SIGNALING FOR PILLOW SPEAKER COMMUNICATION CHANNELS

(71) Applicant: Curbell Medical Products, Inc., Orchard Park, NY (US)

(72) Inventor: Daniel J. MacDonald, East Amherst, NY (US)

(73) Assignee: Curbell Medical Products, Inc., Orchard Park, NY (US)

( * ) Notice: Subject to any disclaimer, the term of this patent is extended or adjusted under 35 U.S.C. 154(b) by 5 days.

(21) Appl. No.: 16/356,584

(22) Filed: Mar. 18, 2019

(65) Prior Publication Data

US 2020/0304122 A1 Sep. 24, 2020

(51) Int. Cl.
*H03K 17/795* (2006.01)
*G08B 25/12* (2006.01)

(52) U.S. Cl.
CPC ......... *H03K 17/7955* (2013.01); *G08B 25/12* (2013.01); *H03K 2217/0009* (2013.01)

(58) Field of Classification Search
CPC ....... H03K 17/7955; H03K 2217/0009; G08B 25/12
See application file for complete search history.

(56) References Cited

U.S. PATENT DOCUMENTS

| | | | | | |
|---|---|---|---|---|---|
| 4,216,462 | A | * | 8/1980 | McGrath | A61B 5/02 600/301 |
| 5,699,038 | A | * | 12/1997 | Ulrich | A61G 12/00 340/286.06 |
| 6,784,797 | B2 | * | 8/2004 | Smith | G08B 21/22 340/286.07 |
| 8,009,021 | B1 | * | 8/2011 | Peters, Jr. | G08B 25/12 340/286.06 |
| 8,046,625 | B2 | * | 10/2011 | Ferguson | A61B 5/0022 714/1 |
| 2014/0092653 | A1 | * | 4/2014 | Suzuki | H03K 17/691 363/55 |
| 2017/0323555 | A1 | * | 11/2017 | Embree | H04L 67/12 |
| 2018/0075961 | A1 | * | 3/2018 | Davis | E05B 47/0002 |

* cited by examiner

*Primary Examiner* — Ryan W Sherwin
(74) *Attorney, Agent, or Firm* — Hodgson Russ LLP (57) ABSTRACT

An interlock system for signaling a nurse call patient station is disclosed. The interlock system may include a first terminal and a second terminal. The first and second terminals may be configured to be connected to corresponding terminals of a signaling loop of a nurse call patient station. The interlock system may further include a connection circuit. The connection circuit may be configured to electrically connect the first terminal to the second terminal. The interlock system may also include a control circuit in communication with, but isolated from, the connection circuit. The control circuit may include a microcontroller. The control circuit may be isolated from the connection circuit by an isolation circuit. The control circuit may be configured to operate the connection circuit to connect or disconnect the first terminal from the second terminal.

19 Claims, 10 Drawing Sheets

PRIOR ART

Fig. 1

PRIOR ART

NURSE CALL AND INTERLOCK SIGNALING FOR PILLOW SPEAKER COMMUNICATION CHANNELS

FIELD OF THE DISCLOSURE

The present disclosure relates to signaling a nurse call patient station from a pillow speaker.

BACKGROUND OF THE DISCLOSURE

Figure 1:
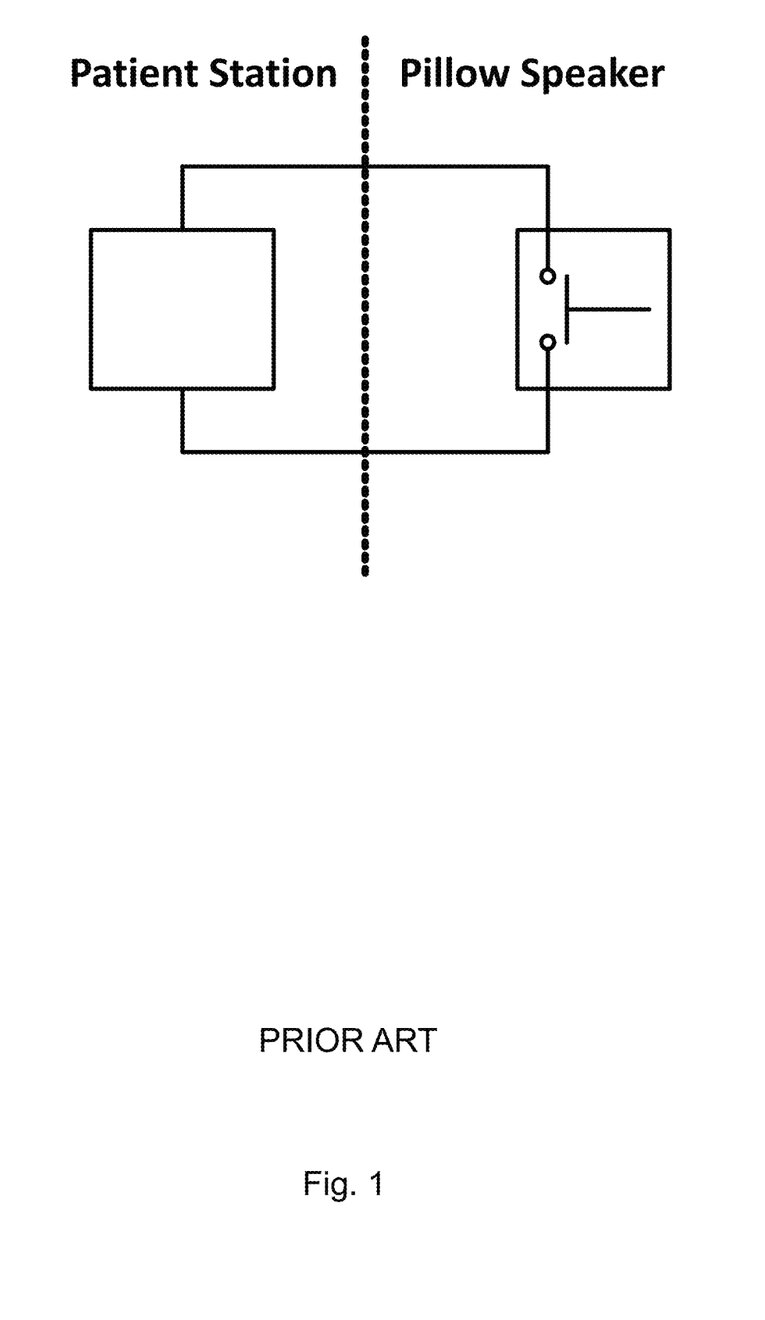
FIG. 1 shows a schematic of a prior art pillow speaker system with a push button.

Traditional nurse call pillow speaker systems utilize a single communication channel between a patient station and a pillow speaker. The communication channel is typically activated by pressing a physical button on the pillow speaker. FIG. 1 illustrates the prior art to signal an analog nurse call to a patient station activated from a pillow speaker. Two conductors connect to the circuitry of the patient station. These two conductors are connected to the pillow speaker when it is plugged into the patient station interface. The two conductors connect to a switch on the pillow speaker. The switch is often implemented as a dry-contact push button, which may be normally open or normally closed (shown as normally open in FIG. 1). When the button is pressed to change the state of the switch, the circuitry of the patient station detects the change in state as a nurse call signal. However, modern nurse call systems often utilize multiple communication signals, and a simple push button is unable to support more than one communication signal.

Figure 2:
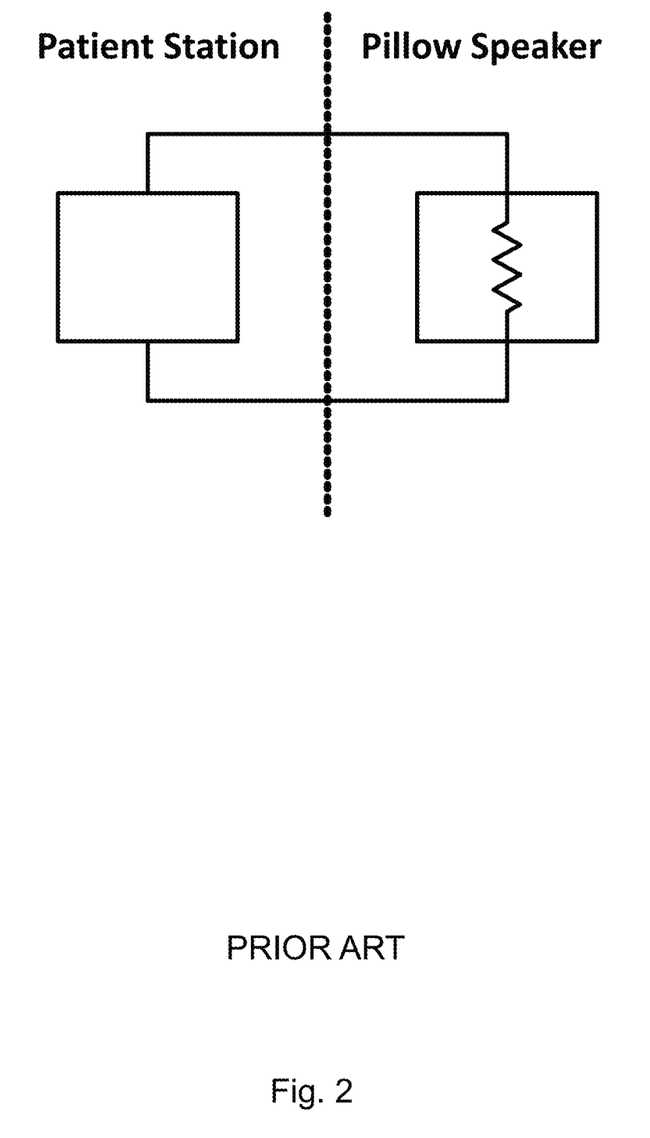
FIG. 2 shows a schematic of a prior art pillow speaker system with interlock signaling.

FIG. 2 illustrates the prior art for an analog interlock system used by the patient station to determine if a pillow speaker is connected. The patient station uses two conductors that connect to the pillow speaker at an interface of the patient station. When connected to the patient station, the pillow speaker provides a connection circuit to complete the interlock circuit and verify its connection. The pillow speaker circuit may be a wire, zero-ohm resistor, or a resistor value specified by the patient station. When the pillow speaker is disconnected from the patient station, the interlock circuit fails open, which causes the patient station to detect the open and throw a "cord out" alarm condition. However, as modern nurse call systems often utilize multiple communication signals, there is a critical need for such an interlock system capable of handling multiple communication channels.

SUMMARY OF THE DISCLOSURE

In an aspect of the present disclosure, an interlock system for signaling a nurse call patient station is disclosed. The interlock system may include a first terminal and a second terminal. The first and second terminals may be configured to be connected to corresponding terminals of a signaling loop of a nurse call patient station. The interlock system may further include a connection circuit. The connection circuit may be configured to electrically connect the first terminal to the second terminal. The interlock system may also include a control circuit in communication with, but isolated from, the connection circuit. The control circuit may include a microcontroller. The control circuit may be isolated from the connection circuit by an isolation circuit. The control circuit may be configured to operate the connection circuit to connect or disconnect the first terminal from the second terminal.

The isolation circuit may include a first optocoupler having a phototransistor to selectively connect the first terminal with the second terminal based on illumination from an LED. The LED may be operated by the control circuit.

The control circuit may include a drive circuit connected to the first optocoupler. The drive circuit may provide electrical power for illuminating the LED of the first optocoupler.

The interlock system may further include a monitoring circuit for determining a state of the interlock system. The monitoring circuit may be configured to detect a current flowing from the first terminal to the second terminal. The monitoring circuit may be configured to detect a voltage potential between the first terminal and the second terminal. The monitoring circuit may include a second optocoupler. The second optocoupler may be configured such that an LED of the second optocoupler is connected between the first terminal and the second terminal and in series with the phototransistor of the first optocoupler. A phototransistor of the second optocoupler may be configured to provide a detection signal based on illumination from the LED of the second optocoupler.

The connection circuit may include a sense resistor. The monitoring circuit may include an isolated sense amplifier. The isolated sense amplifier may be configured to detect voltage developed across the sense resistor as a result of current flowing through the sense resistor. The isolated sense amplifier may also be configured to periodically detect voltage developed across the sense resistor. The isolated sense amplifier may also be configured to deactivate between detection periods.

The monitoring circuit may include a coil connected between the first terminal and the second terminal. The monitoring circuit may include a Hall effect sensor. The Hall effect sensor may be configured to detect a magnetic field generated by a current flowing through the coil. The monitoring circuit may have an output. The output may be configured to provide a feedback signal based on the state of the interlock system.

The monitoring circuit may comprise an active circuit powered by connection between the first terminal and the second terminal. The active circuit may be configured to receive a test signal at an input. The active circuit may be configured to output a corresponding test response at an output. The test signal may be provided by way of a first isolation transformer. The test response may be received by way of a second isolation transformer. The first isolation transformer may be AC-coupled to the input of the active circuit. The second isolation transformer may be AC-coupled to the output of the active circuit.

The test signal may be periodic. The test signal may be aperiodic, as the test signal may be applied irregularly, randomly, or on-demand. The monitoring circuit may be further configured to provide a feedback signal if the test response does not correspond to the periodic signal. The active circuit may be a buffer.

In another aspect of the present disclosure, a method for signaling a nurse call patient station is disclosed. The method may include providing a first terminal and a second terminal. The first and second terminals may be configured to be connected to corresponding terminals of a signaling loop of a nurse call patient station. The method may also include selectively connecting the first terminal with the second terminal according to a signal from a control circuit. The control circuit may be isolated from the first terminal and the second terminal. The isolation of the control circuit from the first terminal and the second terminal may be galvanic. The method may also include monitoring a state of the electrical connection between the first terminal and the second terminal.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Figure 3:
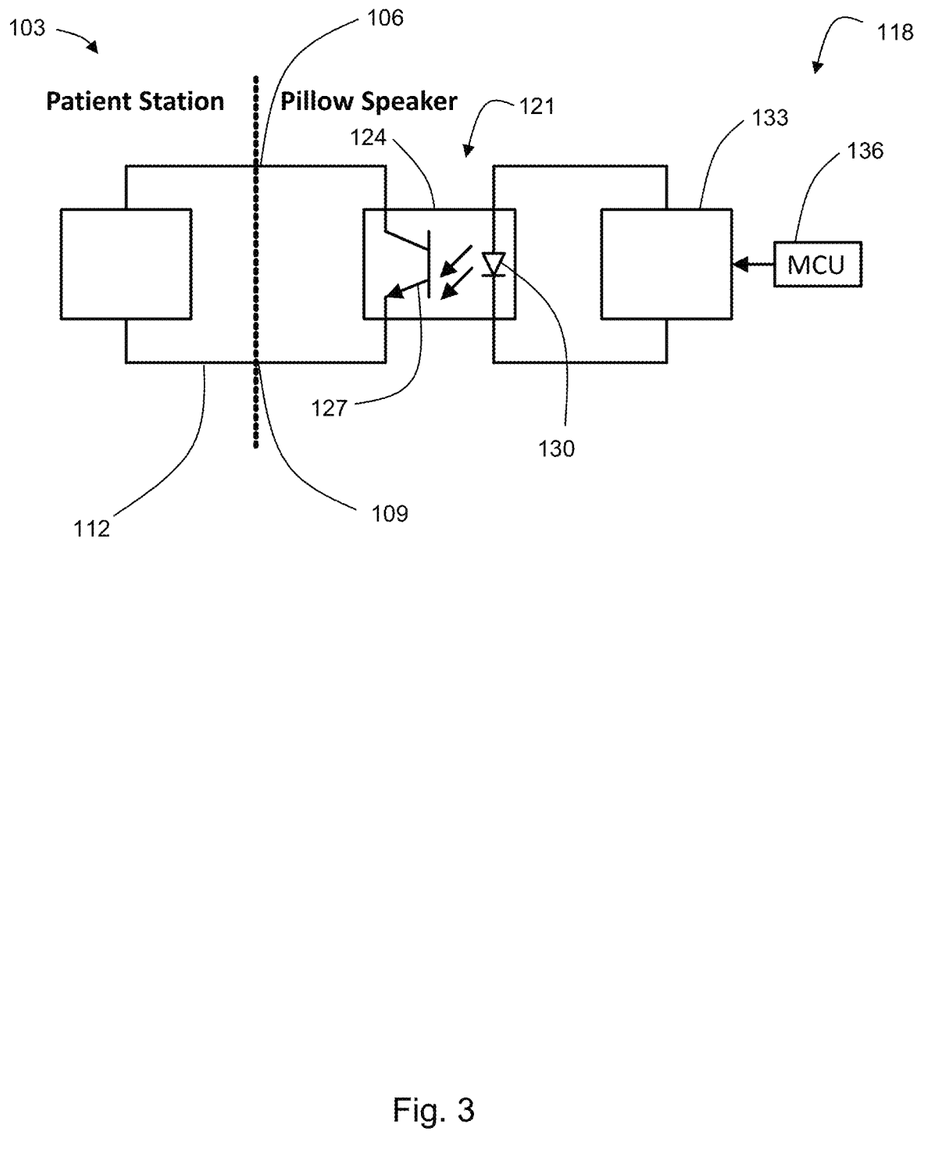
FIG. 3 shows a schematic of an embodiment of the present invention implementing isolated nurse call signaling.
Figure 4:
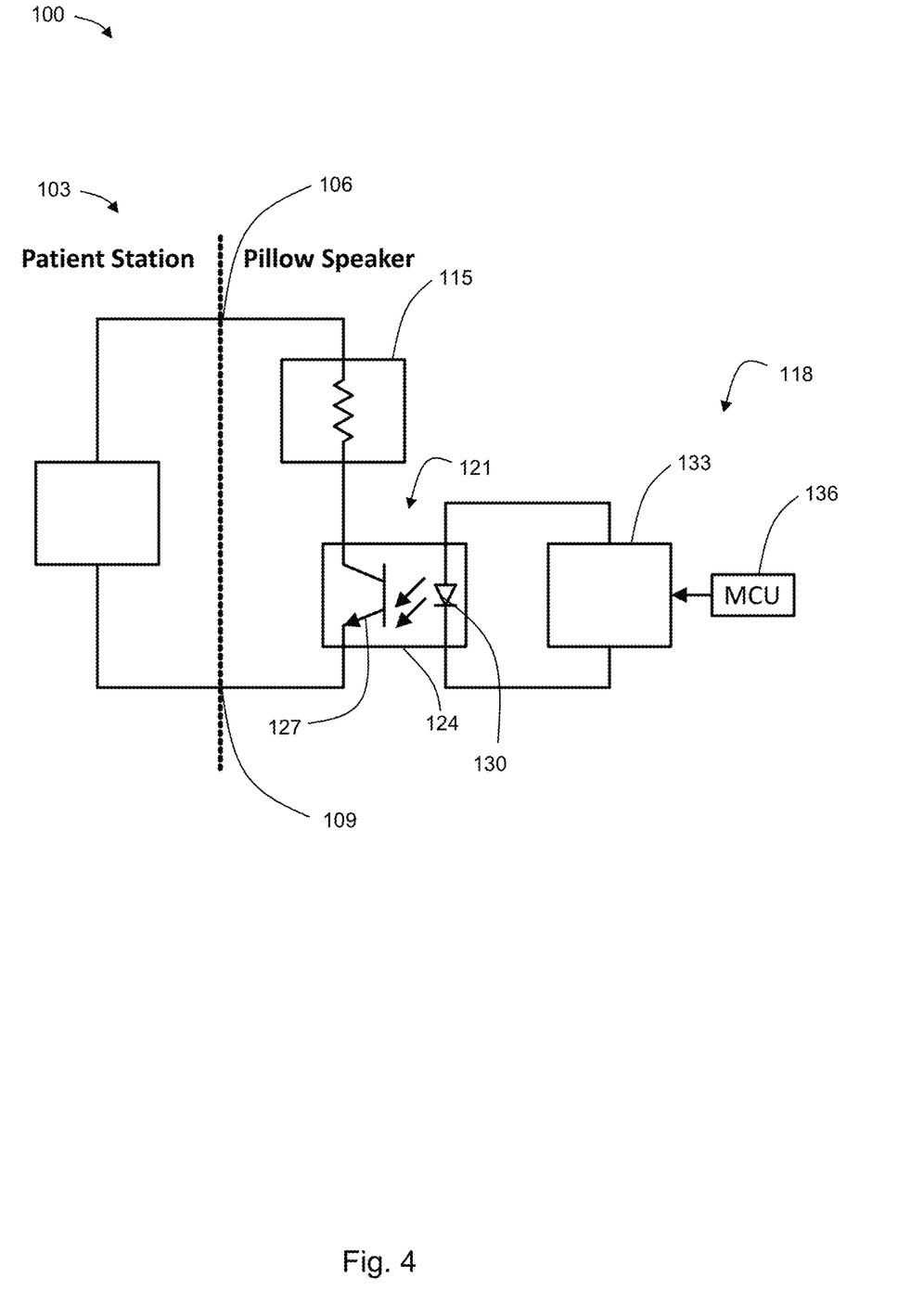
FIG. 4 shows a schematic of an embodiment of the present invention implementing isolated interlock nurse call signaling.

In an aspect of the present disclosure, and with reference to FIGS. 3 and 4, an interlock system 100 for signaling a nurse call patient station 103 is disclosed. The interlock system 100 may include a first terminal 106 and a second terminal 109. The first 106 and second 109 terminals may be configured to be connected to corresponding terminals of a signaling loop 112 of a nurse call patient station 103. The interlock system 100 may further include a connection circuit 115. The connection circuit 115 may be configured to electrically connect the first terminal 106 to the second terminal 109. The interlock system 100 may also include a control circuit 118 in communication with, but isolated from, the connection circuit 115. The control circuit 118 may include a microcontroller 136. The control circuit 118 may be configured to operate the connection circuit 115 to connect or disconnect the first terminal 106 from the second terminal 109.

The control circuit 118 may be isolated from the connection circuit 115 by an isolation circuit 121. The isolation circuit 121 may include a first optocoupler 124 having a phototransistor 127 to selectively connect the first terminal 106 with the second terminal 109 based on illumination from an LED 130. The LED 130 may be operated by the control circuit 118. The control circuit 118 may include a drive circuit 133 connected to the first optocoupler 124. The drive circuit 133 may provide electrical power for illuminating the LED 130 of the first optocoupler 124.

An embodiment of the present disclosure demonstrating a system for isolated nurse call signaling is shown in FIG. 3. In this embodiment, a microcontroller 136 is used to support a plurality of communication channels, while the other components of the system are used to place a nurse call. A nurse call patient station 103 circuit connects to the first terminal 106 and the second terminal 109. In this embodiment, an isolation circuit 121, embodied as an optocoupler 124, performs the same functions as the dry contact switch shown in prior art FIG. 1. The phototransistor 127 is on and conducting current just like a closed dry contact switch when the embedded LED 130 illuminates, with careful attention to minimize the voltage drop across the phototransistor 127 to avoid disrupting the signal expected by the nurse call patient station 103. The control circuit 118 controls the illumination of the embedded LED 130 by providing power via a drive circuit 133. The drive circuit 133 may include one or more resistors to limit current. The drive circuit 133 may include one or more drive transistors. The microcontroller 136 may also control the optocoupler 124 though the control circuit 118 to signal a nurse call.

An embodiment of the present disclosure demonstrating a system for isolated interlock signaling is shown in FIG. 4. In this embodiment, the microcontroller 136 may be used to support a plurality of communication channels, while the other components may be used to report an error that should cause the interlock circuit to go open, i.e., to place a "cord out" alarm signal. The nurse call patient station 103 circuit connects to the first terminal 106 and the second terminal 109. The pillow speaker implements a connection circuit 115 as specified by the nurse call patient station 103. The pillow speaker also implements an isolation circuit 121. In this embodiment, the isolating circuit 121 is an optocoupler 124 where the phototransistor 127 is on and conducting current when the LED 130 is illuminated. The drive circuit 133 supports the illumination of the LED 130 by providing power. The drive circuit 133 may be controlled by the microcontroller 136 when communications with other components indicate a "cord out" alarm should be thrown.

Figure 5:
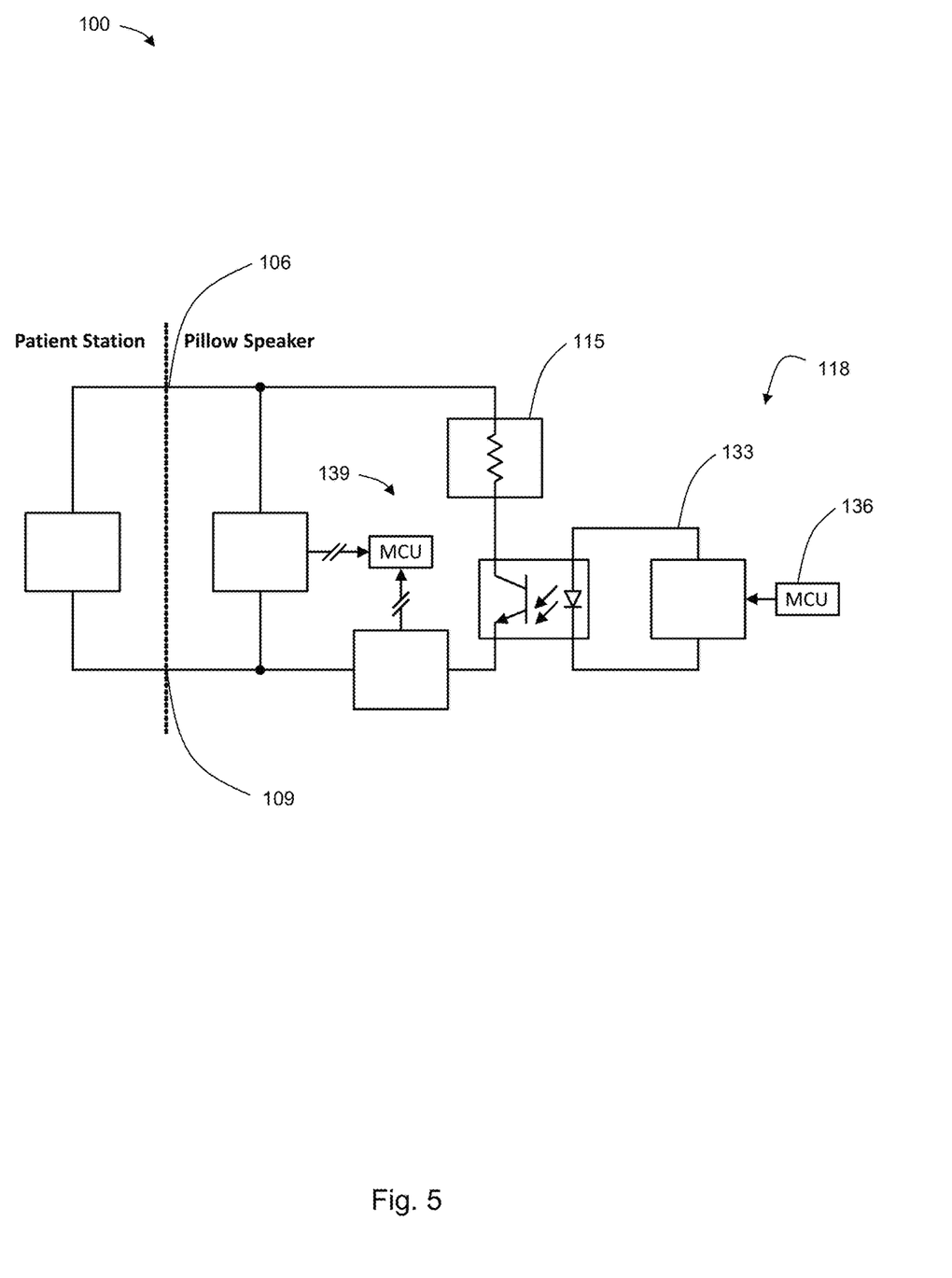
FIG. 5 shows a schematic of an embodiment of the present invention implementing isolated interlock nurse call signaling with feedback.

The interlock system 100, with reference to FIG. 5, may further include a monitoring circuit 139 for determining a state of the interlock system. The monitoring circuit 139 may be configured to detect a current flowing from the first terminal 106 to the second terminal 109. The monitoring circuit 139 may be configured to detect a voltage potential between the first terminal and the second terminal. The monitoring circuit 139 may include a second optocoupler 142. The second optocoupler 142 may be configured such that an LED 145 of the second optocoupler 142 is connected between the first terminal 106 and the second terminal 109 and in series with the phototransistor 127 of the first optocoupler 124. A phototransistor 148 of the second optocoupler 142 may be configured to provide a detection signal 151 based on illumination from the LED 145 of the second optocoupler 142. The phototransistor 148 may be connected to a circuit which provides the detection signal 151. The monitoring circuit 139 may have an output. The output may be configured to provide a feedback signal 154 based on the state of the interlock system 100.

An embodiment of the present disclosure demonstrating a system for providing feedback of the state of the interlock circuit to a monitoring circuit 139 is shown in FIG. 5. In FIG. 5, the monitoring circuit comprises a monitoring microcontroller. While the pillow speaker circuit in FIG. 4 effectively closes or opens the connection circuit 115 based on communication with the microcontroller 136, the control is one-way. If the connection circuit 115 opens due to the nurse call patient station 103 disconnecting from the pillow speaker, the microcontroller 136 has no way of knowing and/or communicating this state back to the other components. FIG. 5 illustrates the concept of a circuit to provide feedback of the state of the interlock circuit to a monitoring microcontroller for communicating with other components in a system. FIG. 5 shows a monitoring circuit 139 in series with the pillow speaker circuit and configured to monitor the current flowing through the connection circuit 115 between the nurse call patient station 103 and the pillow speaker. When the connection circuit 115 is closed and current is flowing, the monitoring circuit 139 sends a corresponding signal to a monitoring microcontroller though an isolation circuit. A limitation to this approach is the small magnitude of current passed through the interlock circuit, which may be too low for a Hall effect current sensor or a board-mount loop-powered isolator.

FIG. 5 also shows a shunt circuit monitoring the voltage between the two conductors of the interlock circuit between the nurse call patient station 103 and the pillow speaker. When the connection circuit 115 is closed and current is flowing, a voltage will be present across the connection circuit 115 that the shunt circuit will detect and signal to the microcontroller through an isolation circuit. When the connection circuit 115 is open and current is not flowing, there will be no voltage drop across the connection circuit 115 for the shunt circuit to detect. Other embodiments for detecting a change in voltage on the interlock signal conductors are possible, such as detecting the change in voltage on a single conductor depending on the implementation of the connection circuit 115.

Figure 6:
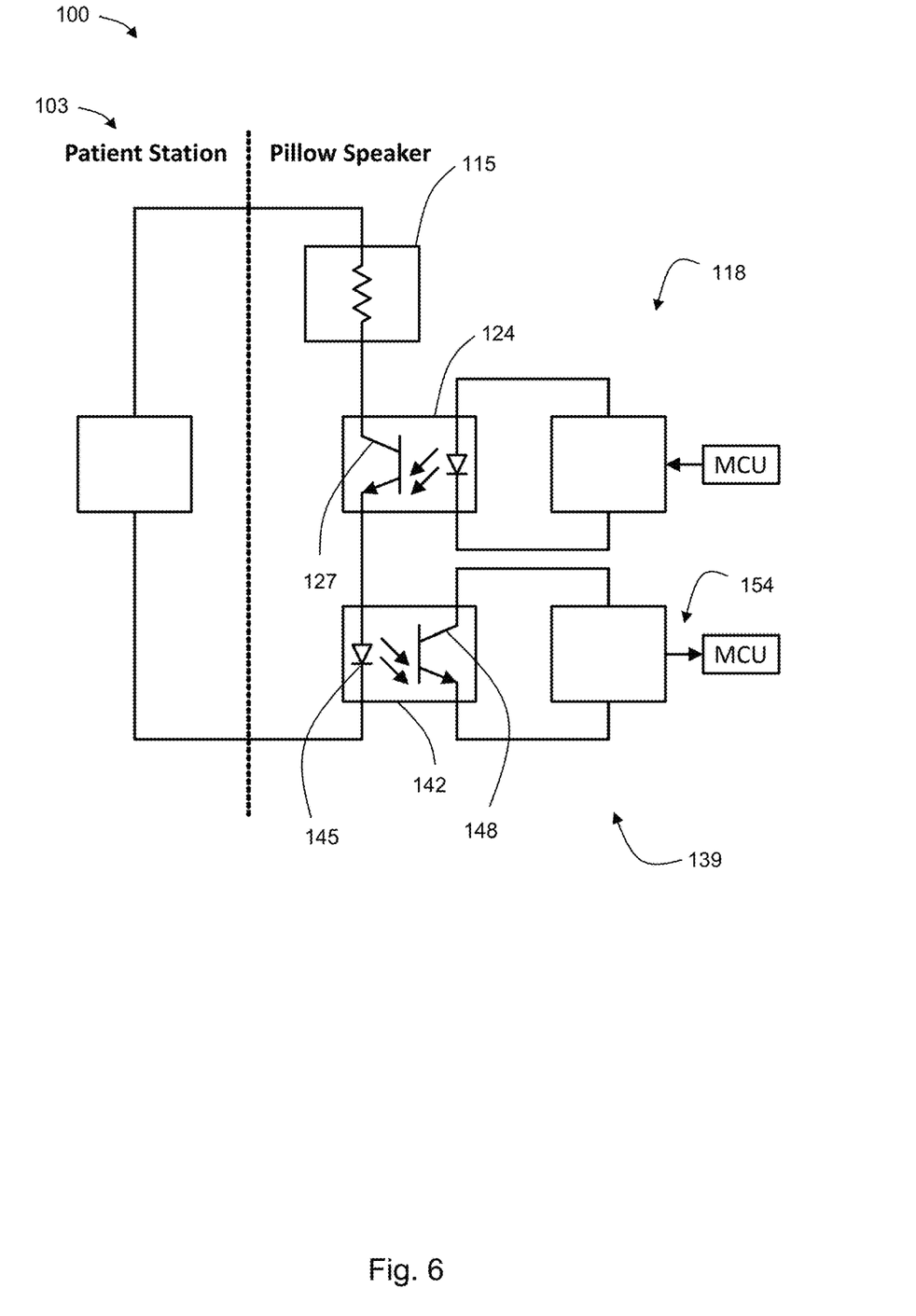
FIG. 6 shows a schematic of an embodiment of the present invention implementing isolated interlock nurse call signaling with feedback via an optocoupler.

An embodiment of the present disclosure demonstrating a system for providing feedback of the state of the interlock system 100 to a microcontroller using a second optocoupler 142 is shown in FIG. 6. In this embodiment, the second optocoupler 142 is connected such that the current flowing through the connection circuit 115 also flows through its LED 145. The LED 145 turns on a phototransistor 148 in the optocoupler 142 on the microcontroller side of the isolation boundary. Accordingly, a monitoring drive circuit may then be used to signal to a monitoring microcontroller that the interlock circuit is complete. Such a monitoring drive circuit may include a pullup resistor to power connected to a collector of the phototransistor 148 of the second optocoupler 142, an input to the monitoring microcontroller tapped in between the pullup resistor and the collector, and a ground connection on the emitter phototransistor of the monitoring optocoupler. When the interlock circuit is complete, the input to the monitoring microcontroller will be pulled down to ground (logic-0) by the optocoupler 142. When the interlock circuit is not complete, the input to the monitoring microcontroller will be pulled up to power (logic-1). The circuit of FIG. 6 has the limitation that the LED 145 in the second optocoupler 142 requires a forward voltage drop to activate. This forward voltage may be too great to reliably signal interlock to the nurse call patient station circuit 103. Furthermore, the nurse call patient station 103 may not provide enough current in the interlock circuit to illuminate the LED 145 in the second optocoupler 142 sufficiently to turn on the phototransistor 148.

Figure 7:
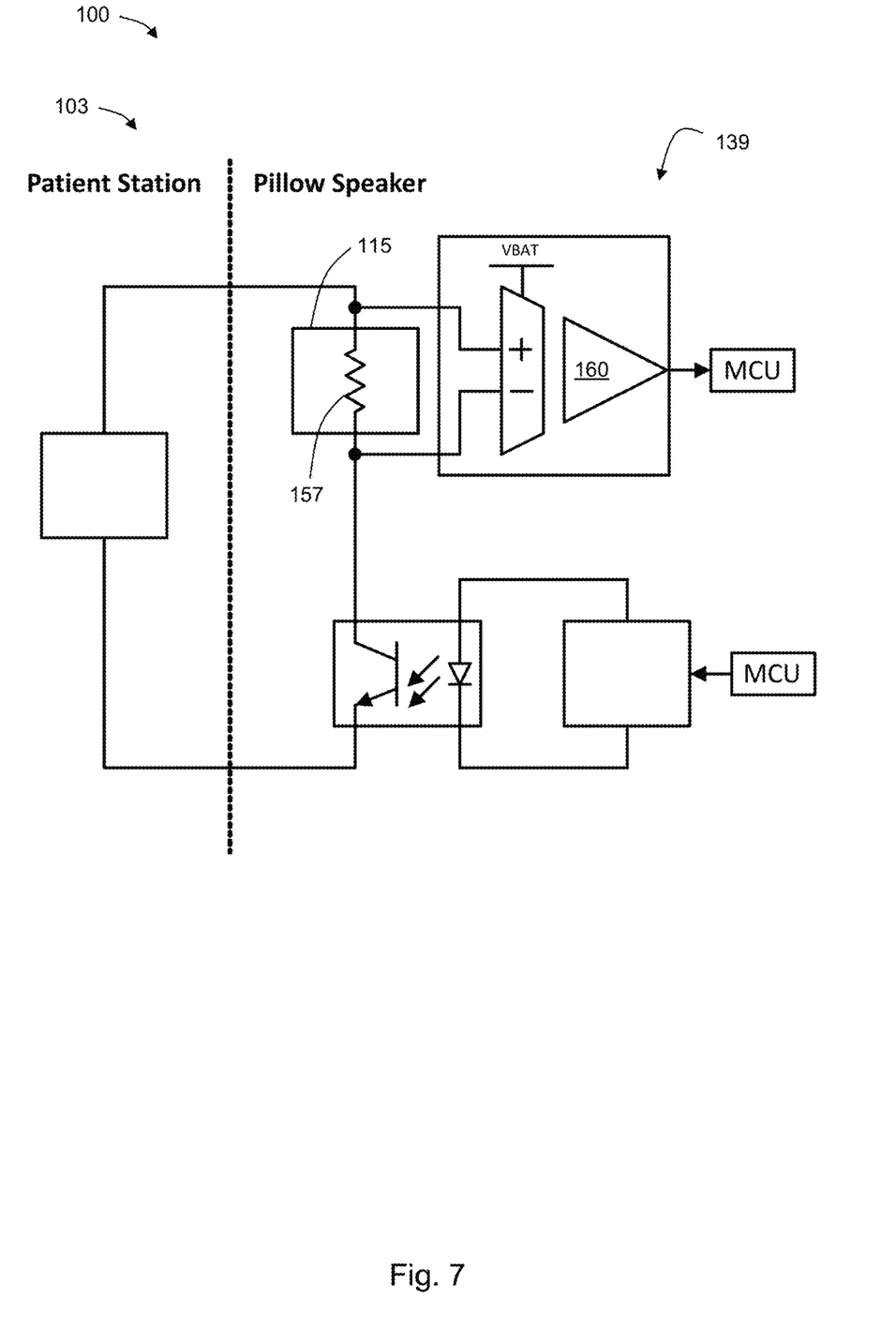
FIG. 7 shows a schematic of an embodiment of the present invention implementing isolated interlock nurse call signaling with feedback via an isolated sense amplifier.

The connection circuit 115 may include a sense resistor 157. The monitoring circuit 139 may include an isolated sense amplifier 160. The isolated sense amplifier 160 may be configured to detect voltage developed across the sense resistor 157 as a result of current flowing through the sense resistor 157. The isolated sense amplifier 160 may also be configured to periodically detect voltage developed across the sense resistor 157. The isolated sense amplifier 160 may also be configured to deactivate between detection periods.

An embodiment of the present disclosure demonstrating a system for providing feedback of the state of the interlock system 100 to a microcontroller using a sense amplifier 160 is shown in FIG. 7. This embodiment uses a sense amplifier 160 to detect the voltages developed across sense resistor 157 as a result of the current flowing through the sense resistor 157 in connection circuit 115 when the interlock circuit is complete. If the resistance value of the sense resistor 157 is too high or too low to develop a voltage drop within the common-mode or differential input range of the isolated sense amplifier 160, then a second resistor with a low or high resistance value may be placed in series with the connection circuit 115 to develop a voltage that the isolated sense amplifier 160 can detect.

The isolated sense amplifier 160 may be embodied as an all-inclusive integrated circuit ("IC") package capable of converting differential inputs to a single-ended logic output that may be input to the monitoring microcontroller for interpretation. When the connection circuit 115 is complete, current flows through the sense resistor 157 in the connection circuit 115 to develop a high enough voltage difference for the isolated sense amplifier 160 to output logic-1 to the monitoring microcontroller. When the connection circuit 115 is not complete, no current will flow through the resistor 157, and the zero voltage difference input to the isolated sense amplifier 160 outputs a logic-0 to the monitoring microcontroller. Support circuitry may be used to allow the isolated sense amplifier 160 to detect the zero voltage difference input. Alternately, the isolated sense amplifier 160 may be have a non-zero reference voltage input (or an internal reference which may be fixed or variable), where a difference voltage above this non-zero value corresponds to logic-1, and a difference voltage below corresponds logic-0.

The isolated sense amplifier 160 is likely to require a power source on both the nurse call patient station 103 and microcontroller sides of the isolation. This is easily provided on the microcontroller side by pulling power from the same source that supplies the microcontroller. However, power on the nurse call patient station 103 side is not guaranteed. Therefore, a small coin cell or other battery, shown by the power symbol labelled VBAT in FIG. 7, may be used to power the nurse call patient station 103 side of the isolated sense amplifier 160 such that the risk of adverse effects from a failed supply is minimized. To conserve battery power, the isolated sense amplifier 160 may be normally deactivated, then briefly and/or periodically turned on to detect if current is present in a completed interlock circuit. This may also be accomplished by using a power transistor in series with the battery. In both cases, the power control driven from the monitoring microcontroller must also be isolated, which may be accomplished using an optocoupler.

Figure 8:
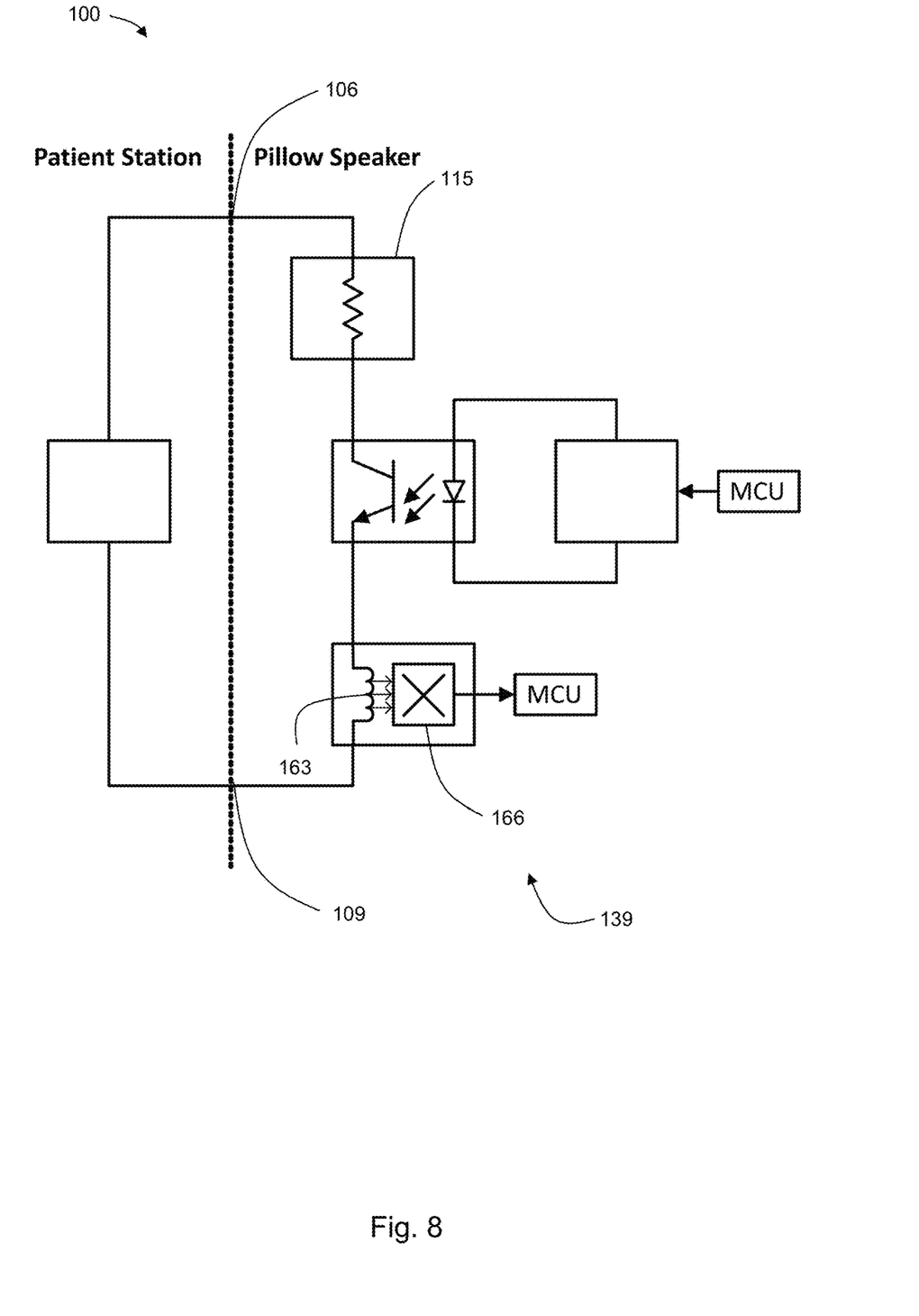
FIG. 8 shows a schematic of an embodiment of the present invention implementing isolated interlock nurse call signaling with feedback via a Hall effect sensor.

The monitoring circuit 139 may include a coil 163 connected between the first terminal 106 and the second terminal 109. The monitoring circuit 139 may include a Hall effect sensor 166. The Hall effect sensor 166 may be configured to detect a magnetic field generated by a current flowing through the coil 163. In another embodiment, the coil 163 may be replaced with a printed circuit board (PCB) trace. In this embodiment, the trace may be physically positioned beneath the Hall effect sensor.

An embodiment of the present disclosure demonstrating a system for providing feedback of the state of the interlock system 100 to a microcontroller using a Hall effect sensor

166 is shown in FIG. 8. In this embodiment, current flowing through a completed connection circuit 115 also flows through a coil of wire 163 to generate a magnetic field. Since the current through the connection circuit is DC and not time-varying, an electromotive force ("EMF") will not be induced on a secondary coil as in a transformer, so the magnetic field, represented by the small arrows in FIG. 8, is sensed directly using a Hall effect sensor 166. Such sensors may exist in a complete surface-mount IC package. The Hall effect sensor 166 IC is configured to provide a digital output to a monitoring microcontroller proportional to the sensed magnetic field strength. The Hall effect sensor 166 IC is powered from the same source supplying the monitoring microcontroller. Isolation is provided by an air gap between the coil 163 and the Hall effect sensor 166 IC. Limitations to this embodiment include the requirement to orient the coil 163, and thus the magnetic field lines, in the direction required by the Hall effect sensor 166 for maximum sensitivity. For example, the magnetic field lines may be oriented in a direction perpendicular to the surface of the Hall effect sensor 166 IC. An additional limitation may be magnetic field strengths which are too low for detection by the Hall effect sensor 166 if the connection circuit 115 current is too low.

Figure 9:
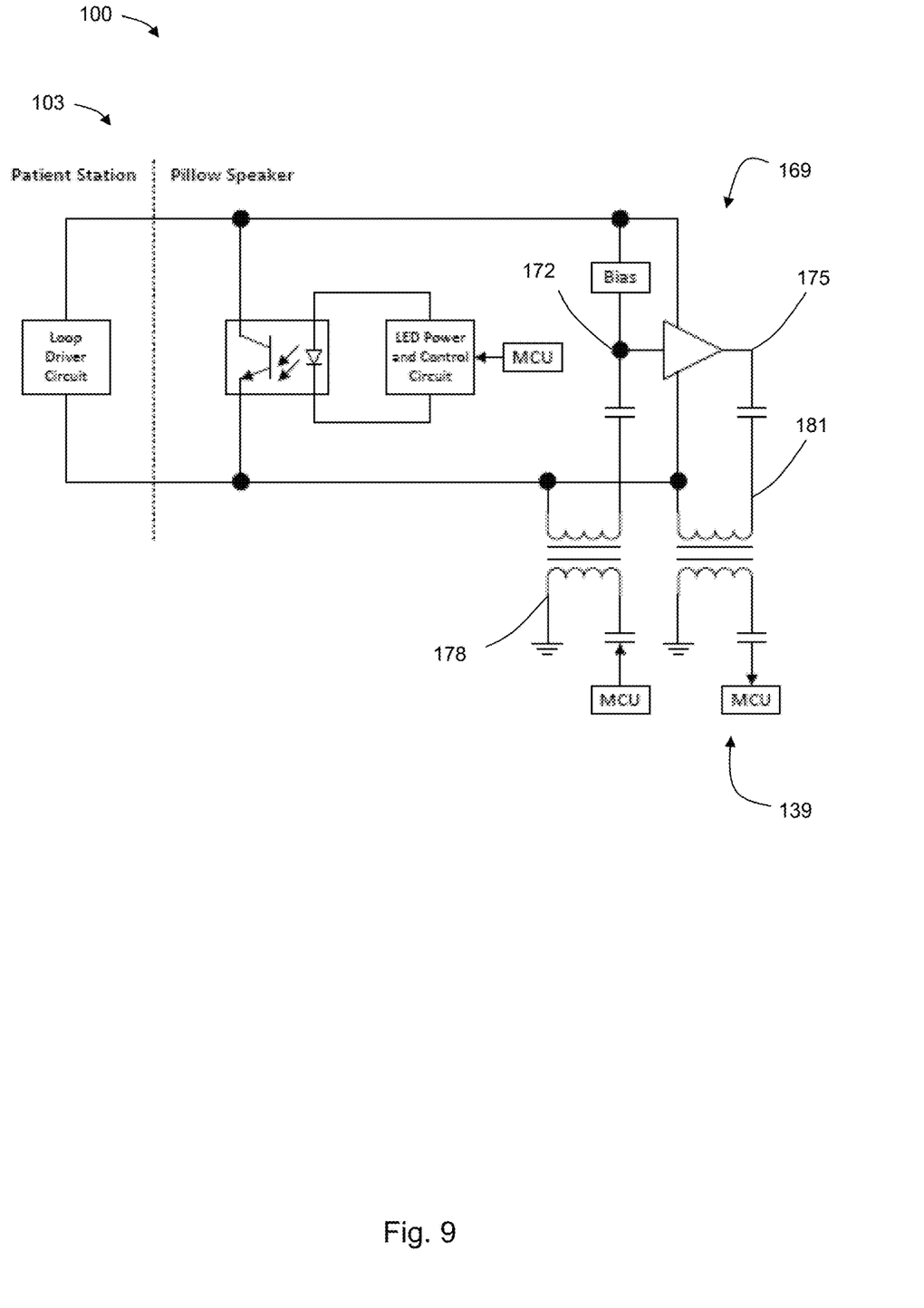
FIG. 9 shows a schematic of an embodiment of the present invention implementing isolated interlock nurse call signaling with periodic feedback via a buffer circuit.

The monitoring circuit 139 may comprise an active circuit 169 powered by connection between the first terminal 106 and the second terminal 109. The active circuit 169 may be configured to receive a test signal at an input 172. The active circuit 169 may be configured to output a corresponding test response at an output 175. The test signal may be provided by way of a first isolation transformer 178. The test response may be received by way of a second isolation transformer 181. The first isolation transformer 178 may be AC-coupled via a capacitor to the input 172 of the active circuit 169. The second isolation transformer 181 may be AC-coupled via a capacitor to the output 175 of the active circuit 169. It is critical that no DC signal reach either transformer, or else the magnetic core of the transformer will saturate, preventing AC signals from propagating.

The test signal may be periodic. The test signal may be aperiodic, as the test signal may be applied irregularly, randomly, or on-demand. The monitoring circuit 139 may be further configured to provide a feedback signal if the test response does not correspond to the test signal. The active circuit 169 may be a buffer. The buffer may be configured, selected, and/or designed for low power consumption due to potential power delivery limitations of the nurse call patient station 103. The buffer may comprise a single logic gate to help reduce power consumption when there is little power supplied by the nurse call patient station 103.

An embodiment of the present disclosure demonstrating a system for providing feedback of the state of the interlock circuit to a microcontroller using an active circuit 169 is shown in FIG. 9. In this embodiment, an output pin of a microcontroller may be configured to periodically drive an AC-coupled single-ended input of an isolation transformer 178. The microcontroller may drive the isolation transformer 178 at any frequency suitable for the transformer 178, where higher frequencies may result in smaller components at the cost of higher dynamic power.

The isolated periodic signal is AC-coupled to the input of a single discrete logic buffer (or other suitable logic gate). The buffer is powered from the nurse call patient station 103. Using a single logic gate may significantly reduce the power required from the interlock loop such that the logic gate effectively presents no electrical load to disturb the interlock circuit.

A bias circuit may be needed to set the DC voltage on the logic gate input 172. The bias circuit may be a voltage divider constructed from the center tap of two matched high-value resistors connected in series between the interlock circuit source and return points so that the power drawn from the loop is negligible.

The logic gate output 175 is AC-coupled to a second single-ended isolation transformer 181. The output AC-coupling capacitor value is as low as possible to reduce power drawn by the logic gate to drive it while passing the periodic signal at its chosen frequency. The isolation transformer 181 AC-couples the periodic signal to an input pin of a monitoring microcontroller (which may also require a DC bias).

When the interlock circuit is connected (i.e., when the nurse call patient station cable is plugged in to the pillow speaker), limited power is available for the logic gate to complete the loopback test of the periodic signal driven from and returned to the monitoring microcontroller. When the interlock circuit is not connected (i.e., when the nurse call patient station cable is not plugged in to the pillow speaker) there is no power available for the logic gate, so the loopback test will not be successfully completed. Hence, the monitoring microcontroller will know when the interlock circuit is not connected.

The microcontroller may drive the LED Power and Control Circuit to force the interlock circuit to be open even though the nurse call patient station cable is plugged in. The microcontroller may also stop driving the periodic signal to the logic gate so that no static or dynamic power is drawn from the interlock circuit to ensure the interlock circuit remains open.

In another embodiment, a microcontroller could possibly drive a differential signal to the isolation transformer 178, in a one pin per coil end configuration. In this embodiment, the ground symbol on transformer 178 would be replaced with another microcontroller pin. A differential signal on the output side of the transformer 178 could then be connected to the two inputs of a differential amplifier. Each of the two inputs are AC-coupled to avoid DC bias in the transformer 178. This configuration would simplify logic detection at the cost of more power consumed by the amplifier. Accordingly, this embodiment would likely use a very low power, and likely slow, amplifier. The amplifier could also have fully differential outputs, and the second transformer 181 could connect to two pins or even an integrated amplifier in the microcontroller.

Figure 10:
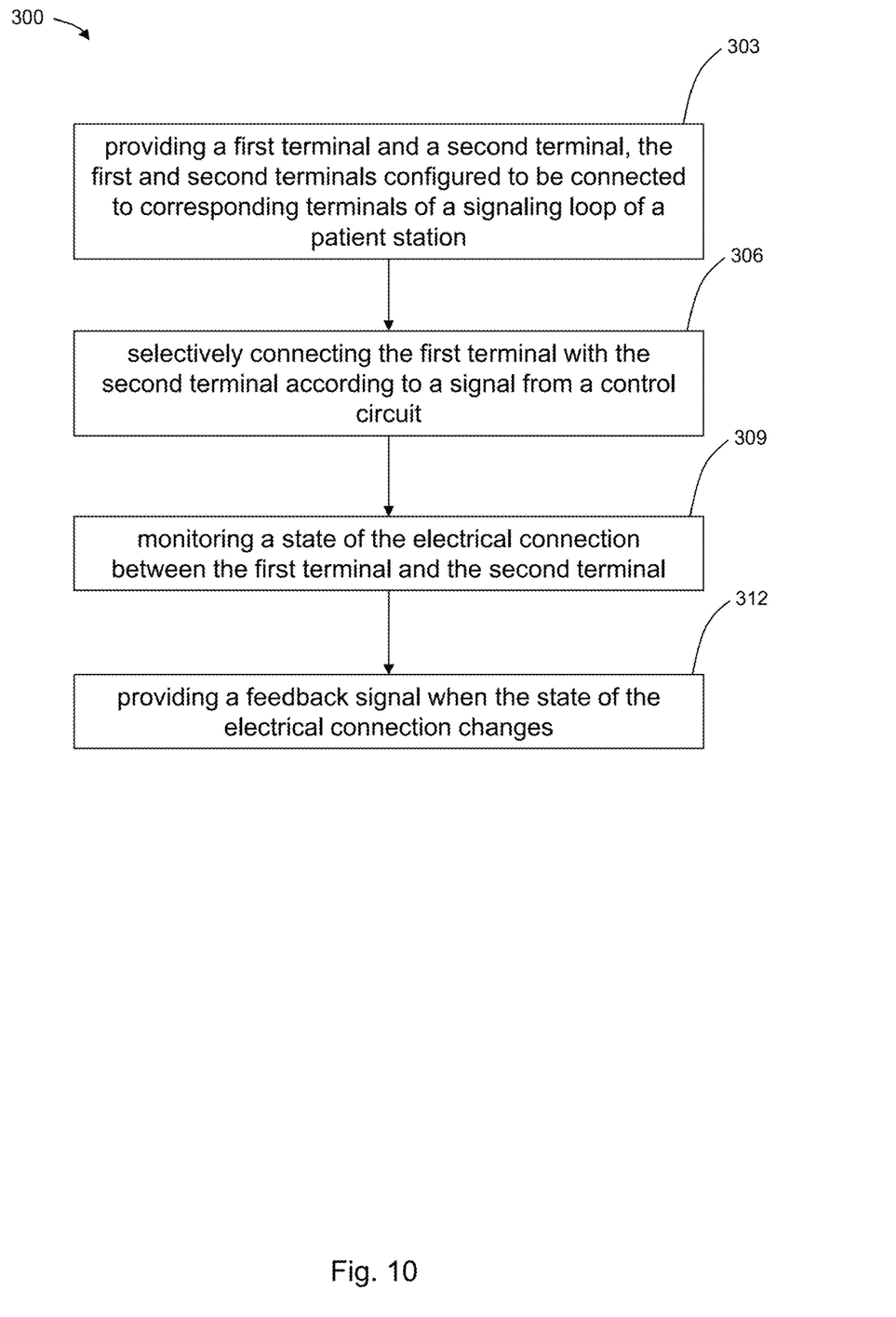
FIG. 10 shows a block diagram of a method according to an embodiment of the present invention.

In another aspect of the present disclosure, a method 300 for signaling a nurse call patient station is disclosed. An embodiment of the method 300 is shown in FIG. 10. The method 300 may include providing 303 a first terminal and a second terminal. The first and second terminals may be configured to be connected to corresponding terminals of a signaling loop of a nurse call patient station. The method 300 may also include selectively connecting 306 the first terminal with the second terminal according to a signal from a control circuit. The control circuit may be isolated from the first terminal and the second terminal. The isolation of the control circuit from the first terminal and the second terminal may be galvanic. The method may also include monitoring 309 a state of the electrical connection between the first terminal and the second terminal. The method may also include providing 312 a feedback signal when the state of the electrical connection changes.

Although the present disclosure has been described with respect to one or more particular embodiments, it will be understood that other embodiments of the present disclosure may be made without departing from the spirit and scope of the present disclosure. Hence, the present disclosure is deemed limited only by the appended claims and the reasonable interpretation thereof

What is claimed is:

1. An interlock system for signaling a nurse call patient station, comprising:
   a first terminal and a second terminal, the first and second terminals configured to be connected to corresponding terminals of a signaling loop of a nurse call patient station;
   a connection circuit configured to electrically connect the first terminal to the second terminal to complete an interlock circuit from the first terminal to the second terminal; and
   a control circuit in communication with the connection circuit, but isolated from the connection circuit by an isolation circuit, the control circuit configured to operate the connection circuit to connect or disconnect the first terminal from the second terminal.

2. The interlock system of claim 1, wherein the isolation circuit comprises a first optocoupler having a phototransistor to selectively connect the first terminal with the second terminal based on illumination from a light-emitting diode ("LED"), and the LED is operated by the control circuit.

3. The interlock system of claim 2, wherein the control circuit comprises a drive circuit connected to the first optocoupler; and wherein the drive circuit provides electrical power for illuminating the LED of the first optocoupler.

4. The interlock system of claim 1, wherein the control circuit comprises a microcontroller.

5. The interlock system of claim 1, further comprising a monitoring circuit for determining a state of the interlock system.

6. The interlock system of claim 5, wherein the monitoring circuit is configured to detect a current flowing from the first terminal to the second terminal.

7. The interlock system of claim 6, wherein the connection circuit comprises a sense resistor; and wherein the monitoring circuit comprises an isolated sense amplifier configured to detect current flowing through the sense resistor.

8. The interlock system of claim 7, wherein the isolated sense amplifier is configured to periodically detect current flowing through the sense resistor and to deactivate between detection periods.

9. The interlock system of claim 6, wherein the monitoring circuit comprises a coil connected between the first terminal and the second terminal, and a Hall effect sensor is configured to detect a magnetic field generated by a current flowing through the coil.

10. The interlock system of claim 5, wherein the monitoring circuit is configured to detect a voltage potential between the first terminal and the second terminal.

11. The interlock system of claim 2, further comprising a monitoring circuit comprising a second optocoupler configured such that an LED of the second optocoupler is connected between the first terminal and the second terminal and in series with the phototransistor of the first optocoupler, and a phototransistor of the second optocoupler is configured to provide a detection signal based on illumination from the LED of the second optocoupler.

12. The interlock system of claim 5, wherein the monitoring circuit has an output configured to provide a feedback signal based on the state of the interlock system.

13. The interlock system of claim 5, wherein the monitoring circuit comprises an active circuit powered by connection between the first terminal and the second terminal, the active circuit configured to receive a test signal at an input and to output a corresponding test response at an output.

14. The interlock system of claim 13, wherein the monitoring circuit is further configured to provide a feedback signal if the test response does not correspond to the test signal.

15. The interlock system of claim 13, wherein the active circuit is a buffer.

16. The interlock system of claim 15, wherein the test signal is provided by way of a first isolation transformer and the test response is received by way of a second isolation transformer.

17. The interlock system of claim 16, wherein the first isolation transformer is alternating current (AC)-coupled to the input of the active circuit and the second isolation transformer is AC-coupled to the output of the active circuit.

18. A method for signaling a nurse call patient station, comprising:
   providing a first terminal and a second terminal, the first and second terminals configured to be connected to corresponding terminals of a signaling loop of a nurse call patient station;
   selectively connecting the first terminal with the second terminal to complete an interlock circuit from the first terminal to the second terminal according to a signal from a control circuit;
   monitoring a state of the electrical connection between the first terminal and the second terminal; and
   providing a feedback signal when the state of the electrical connection changes.

19. The method of claim 18, wherein the control circuit is galvanically isolated from the first terminal and the second terminal.

* * * * *